(12) United States Patent
Caspary et al.

(10) Patent No.: US 7,378,727 B2
(45) Date of Patent: May 27, 2008

(54) MEMORY DEVICE AND A METHOD OF FORMING A MEMORY DEVICE

(76) Inventors: Dirk Caspary, Am Steinborn 1, 01109 Dresden (DE); Stefano Parascandola, Hendrichstrasse 35, 01109 Dresden (DE)

( * ) Notice: Subject to any disclaimer, the term of this patent is extended or adjusted under 35 U.S.C. 154(b) by 2 days.

(21) Appl. No.: 11/327,054

(22) Filed: Jan. 6, 2006

(65) Prior Publication Data

US 2007/0158688 A1 Jul. 12, 2007

(51) Int. Cl.
*H01L 23/48* (2006.01)
(52) U.S. Cl. .................... 257/692; 257/695; 257/677; 257/E21.511; 257/E23.001
(58) Field of Classification Search ............... None
See application file for complete search history.

(56) References Cited

U.S. PATENT DOCUMENTS 4,630,355 A * 12/1986 Johnson ............... 438/6
6,927,119 B2 8/2005 Lee et al.
2002/0142555 A1 10/2002 Cha
2003/0025149 A1 2/2003 Kanai \* cited by examiner

*Primary Examiner*—A. Sefer
*Assistant Examiner*—Scott R. Wilson
(74) *Attorney, Agent, or Firm*—Dicke, Billig & Czaja, P.L.L.C.

(57) ABSTRACT

A memory device includes a semiconductor substrate having a surface, a plurality of first and second conductive lines, a plurality of memory cells, and a plurality of landing pads. Each of the first conductive lines has a line width wb and two neighboring ones of the first conductive lines having a distance bs from each other. Each of the second conductive lines has a line width wl and two neighboring ones of the second conductive lines having a distance ws from each other. Each memory cell is accessible by addressing corresponding ones of said first and second conductive lines. Each of the landing pads are made of a conductive material and are connected with a corresponding one of said second conductive lines. Each of said landing pads has a width wp and length lp and the line width wl of each of the second conductive lines is larger than the distance ws and the width wp of each of the landing pads is larger than the line width wl and the length lp of each of the landing pads is larger than the line width wl.

12 Claims, 19 Drawing Sheets

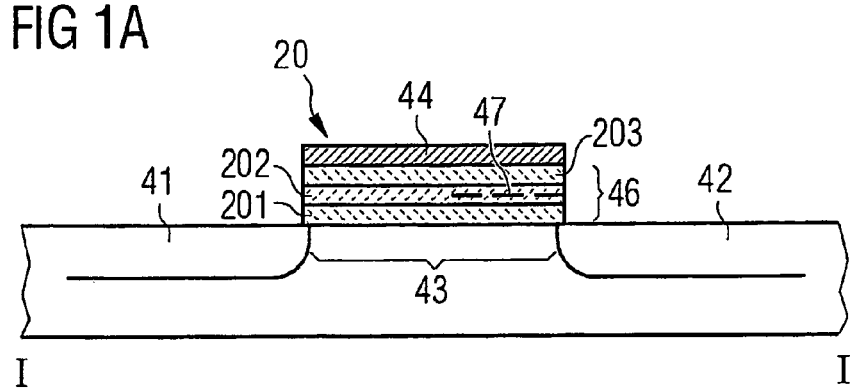
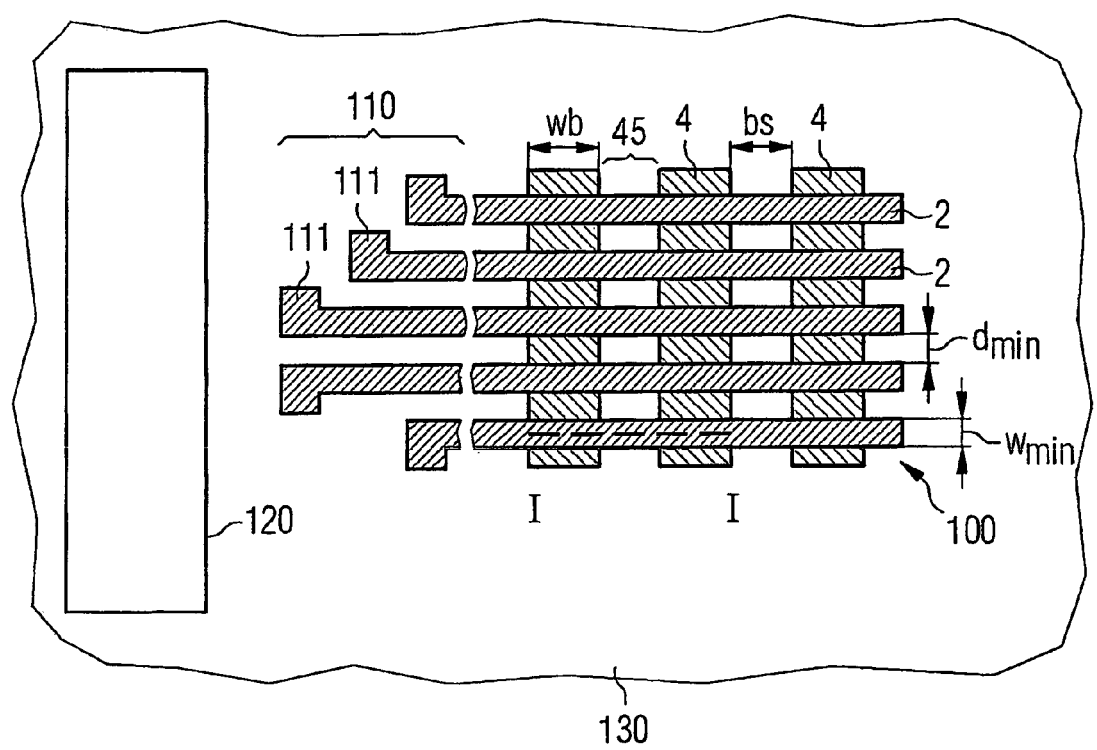

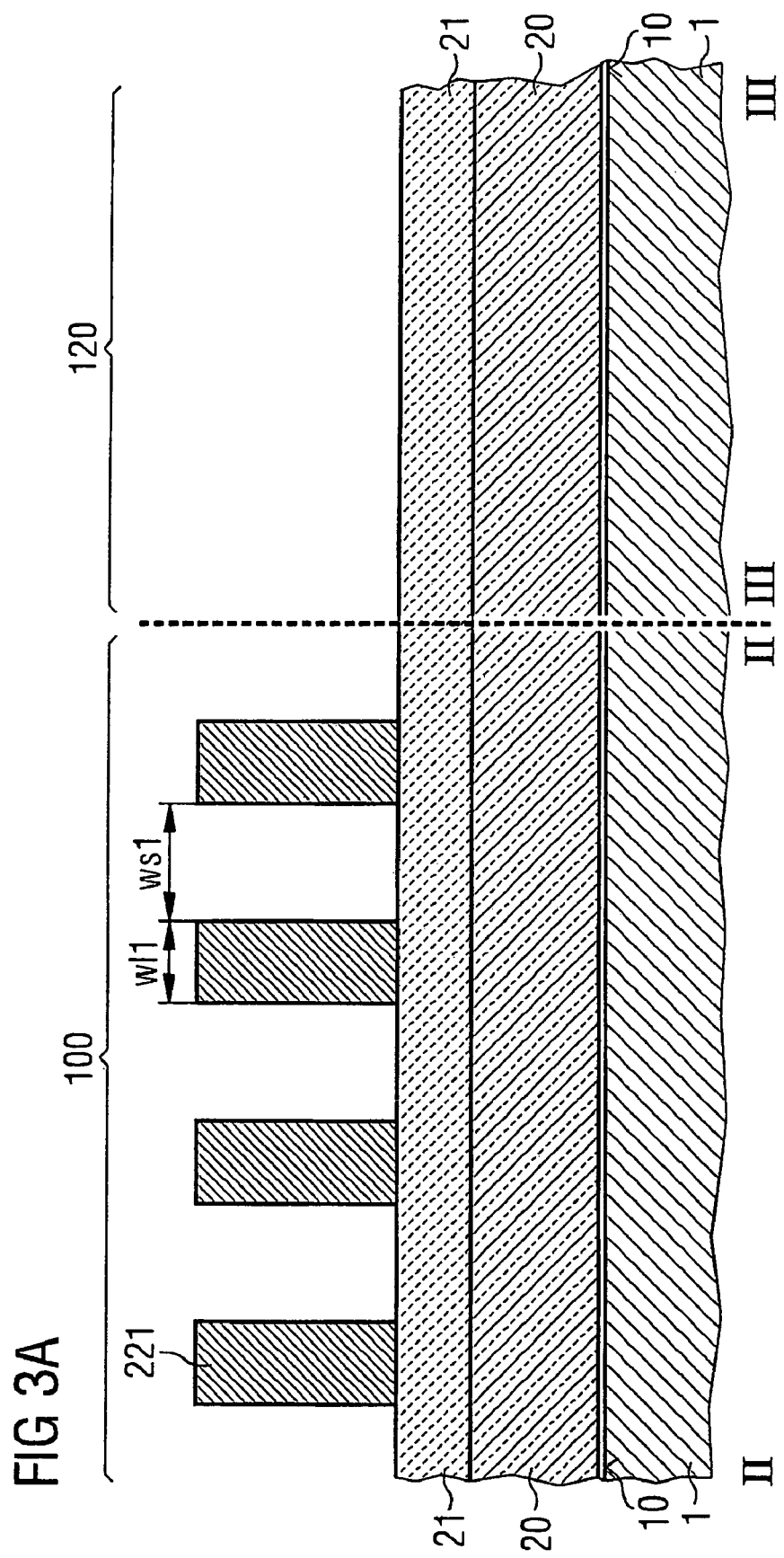

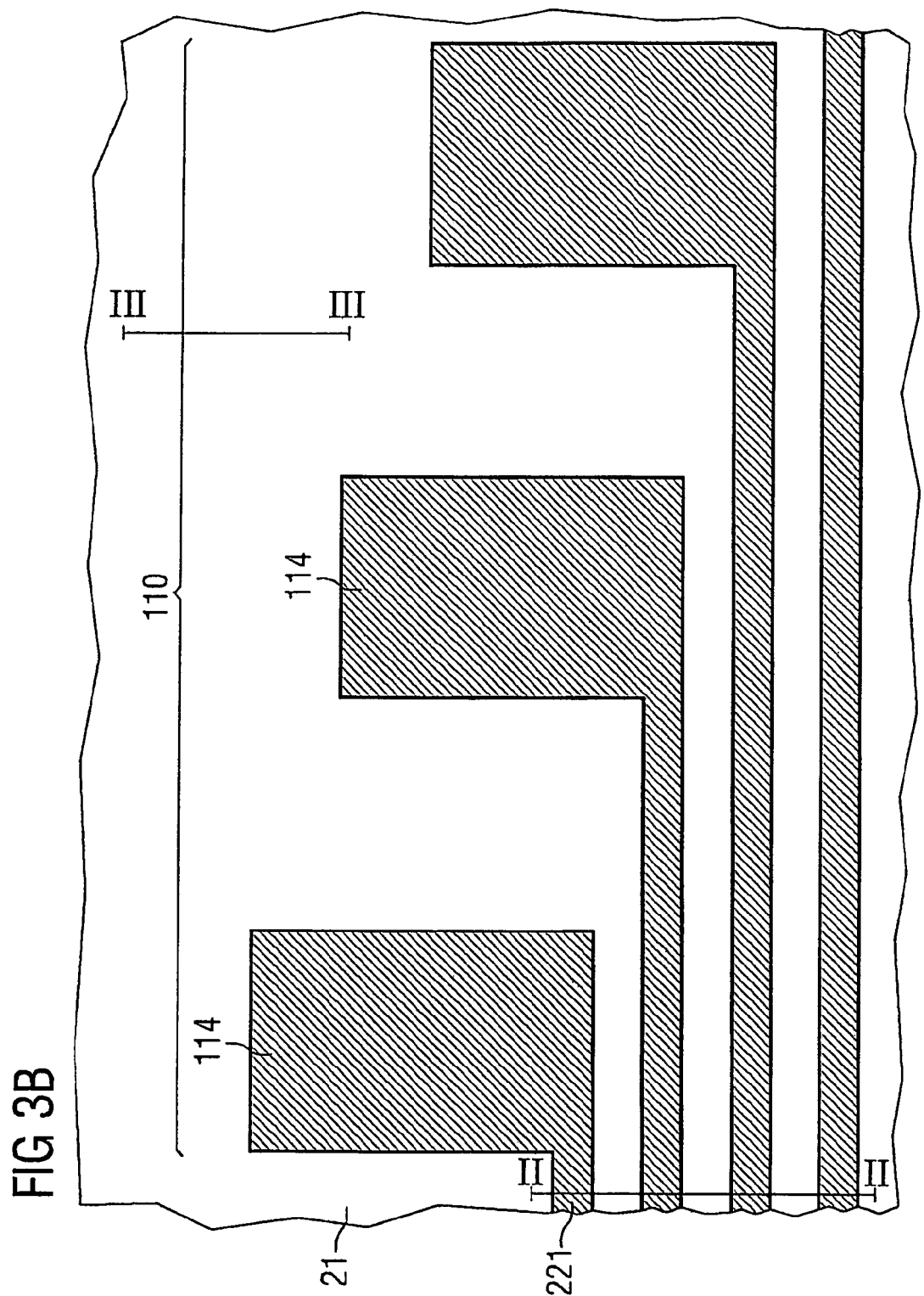

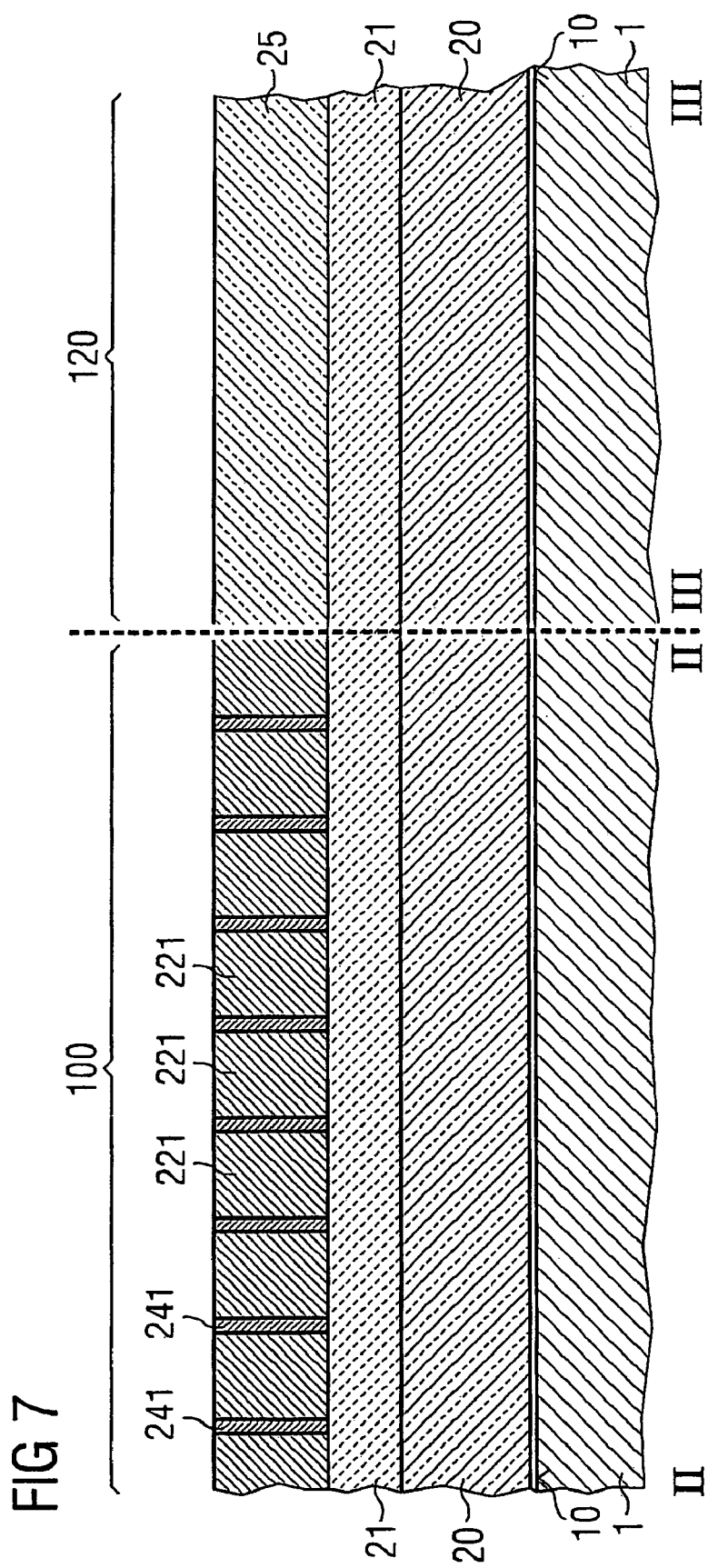

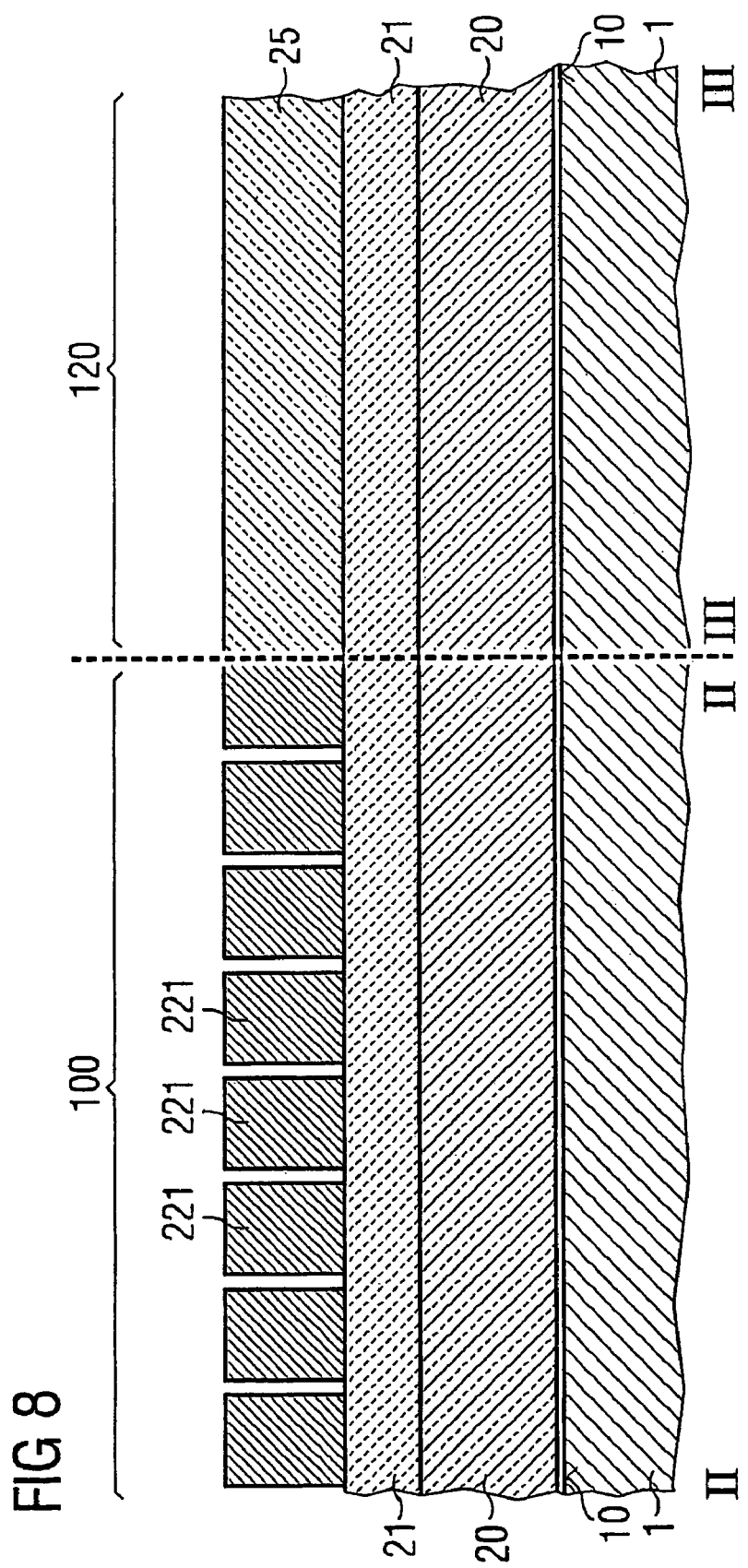

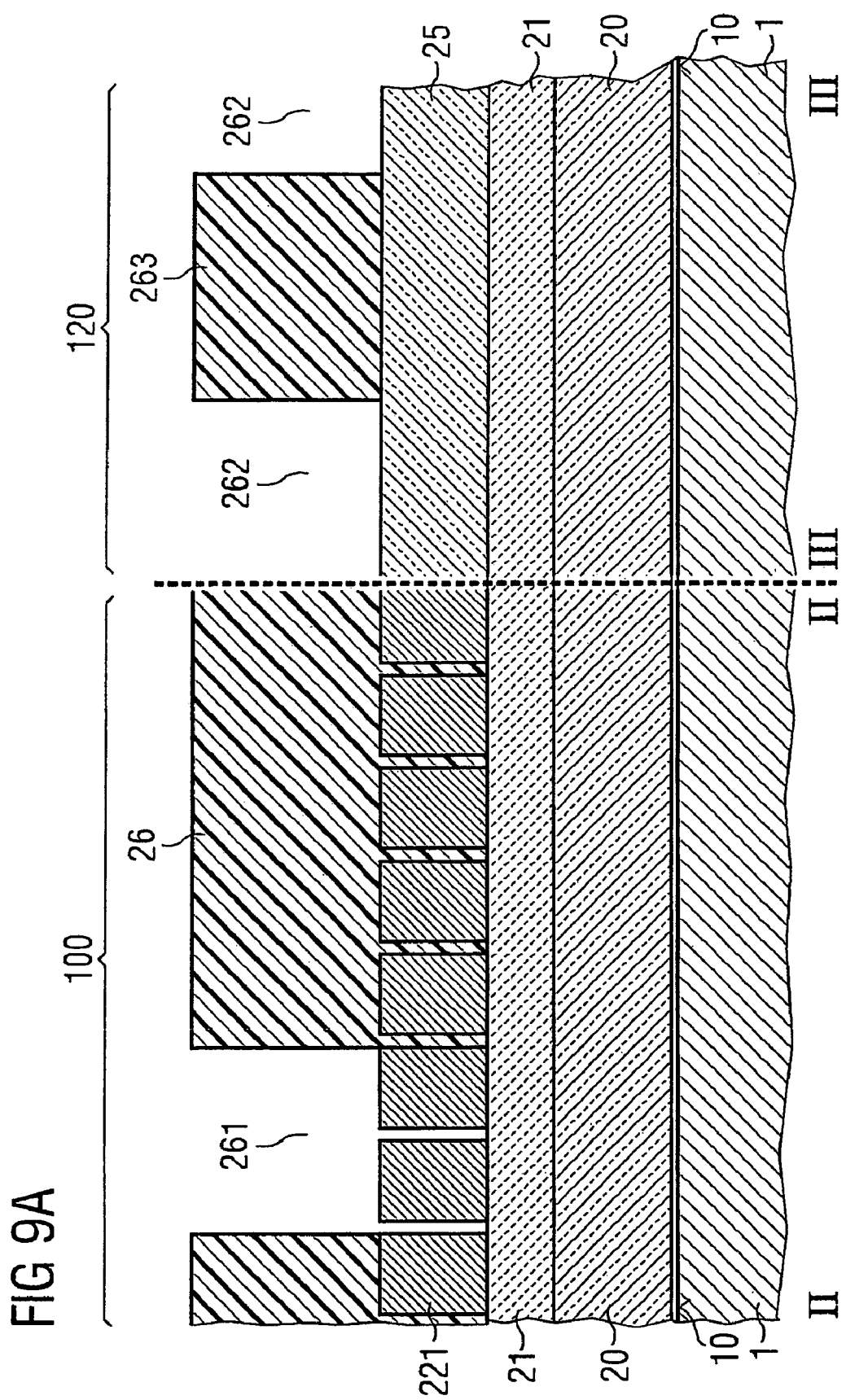

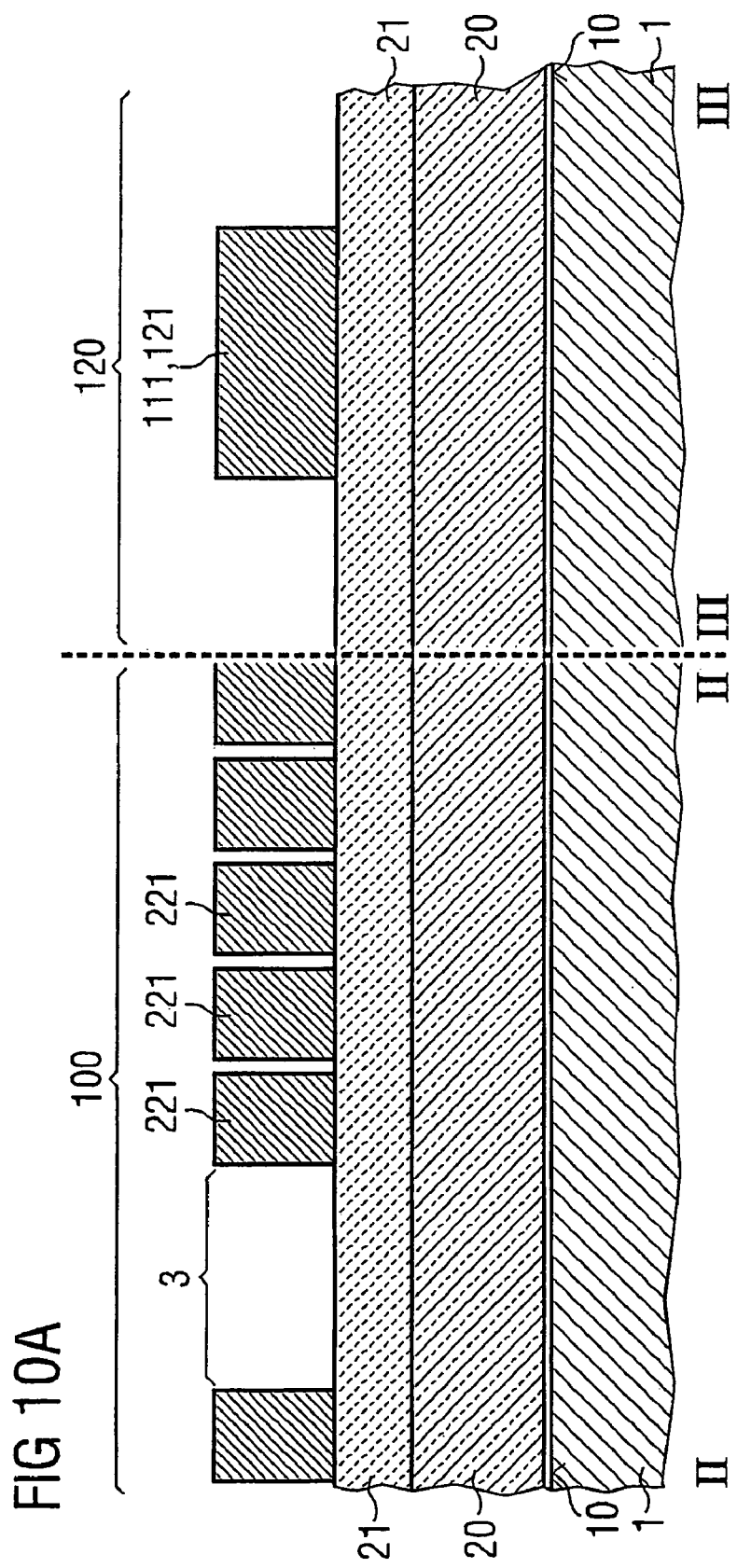

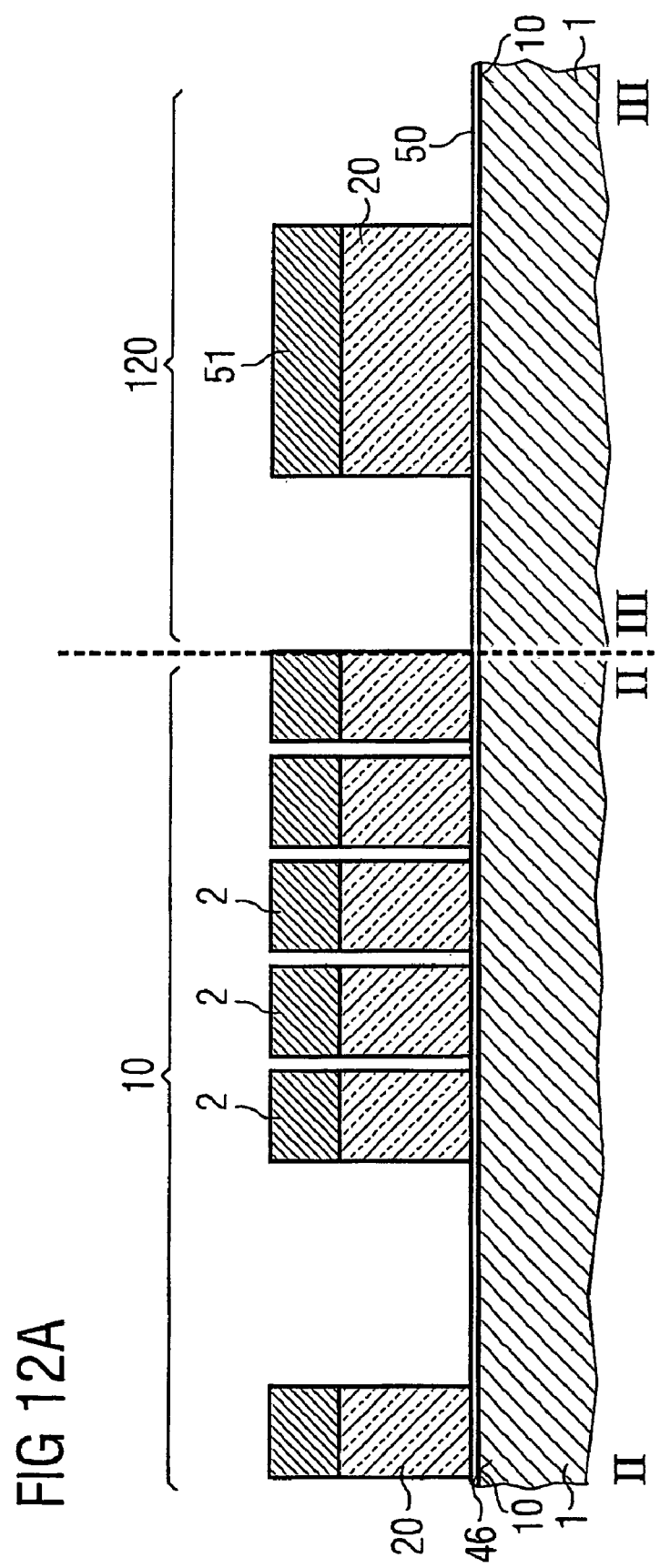

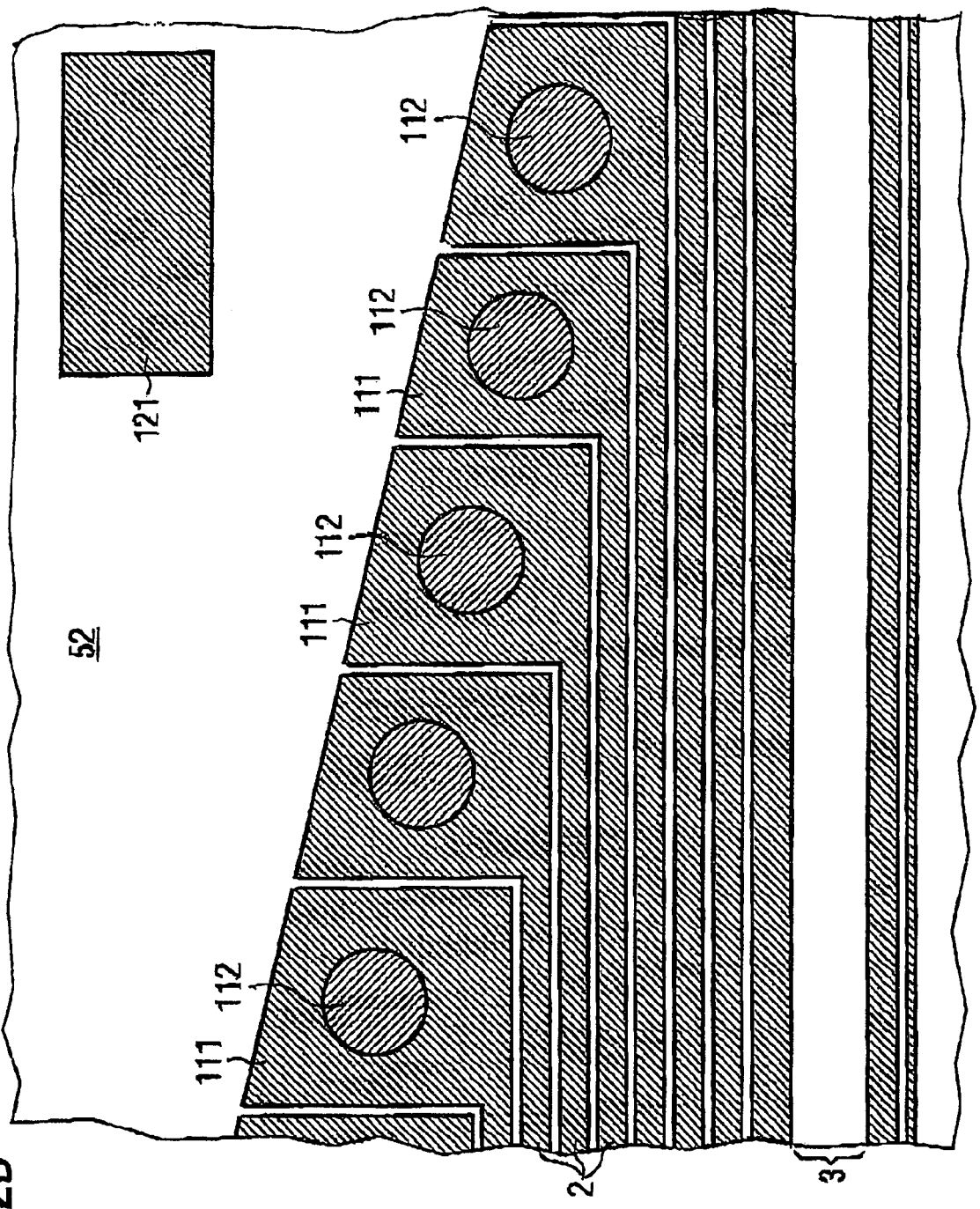

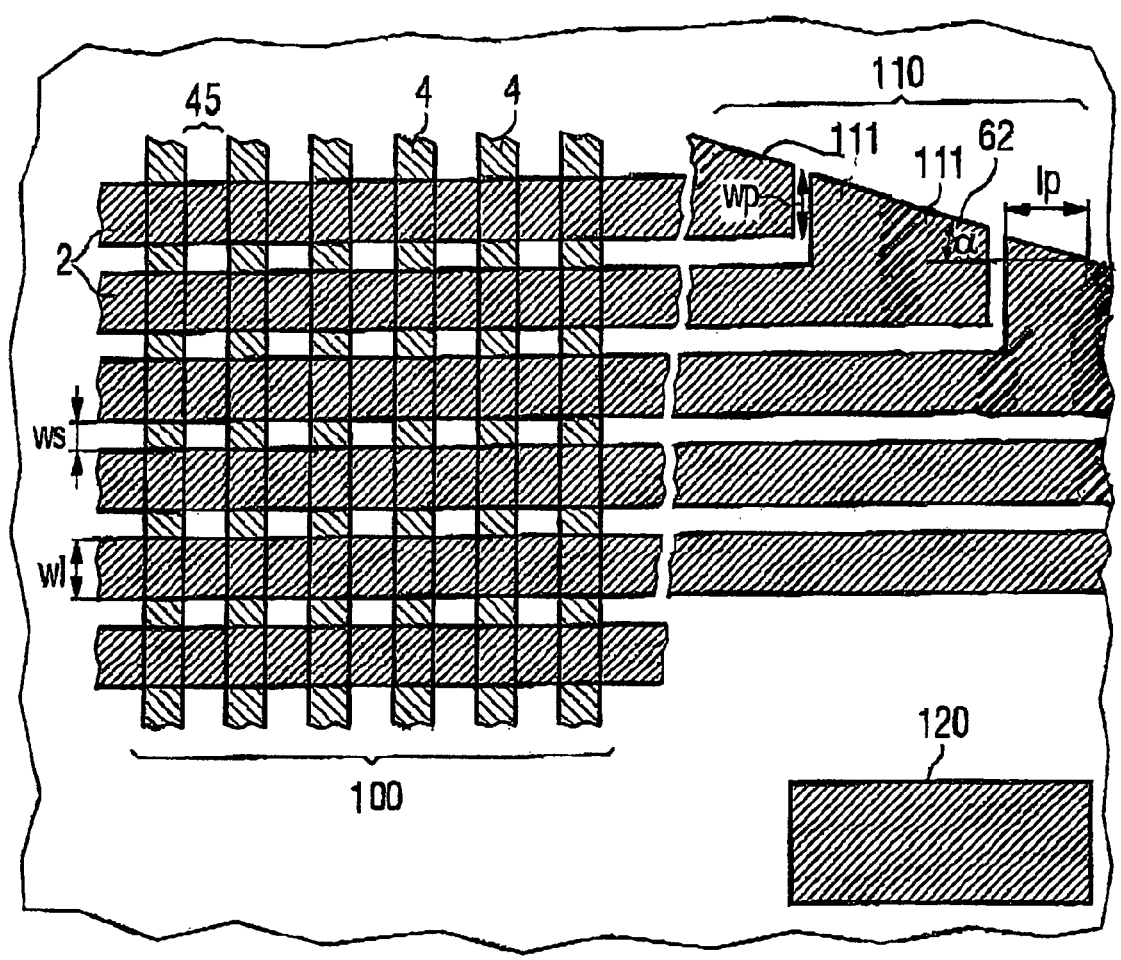

MEMORY DEVICE AND A METHOD OF FORMING A MEMORY DEVICE

CROSS REFERENCE TO RELATED APPLICATIONS

This Utility Patent Application claims priority to U.S. patent application Ser. No. 11/241,820, filed on Sep. 30, 2005, which is incorporated herein by reference.

BACKGROUND

This invention relates to a memory device. In addition, the invention relates to a method of forming a corresponding memory device. Semiconductor memory devices include arrays of memory cells that are arranged in rows and columns. The gate electrodes of rows of memory cell transistors are connected by word lines, by which the memory cells are addressed. The word lines usually are formed by patterning a conductive layer stack so as to form single word lines which are arranged in parallel. The word lines are electrically insulated from one another laterally by a dielectric material. The lateral distance between two word lines and the width of a word line sum to the pitch of the array of word lines. The pitch is the dimension of the periodicity of a periodic pattern arrangement. The word lines succeed one another in a completely periodic fashion, in order to reduce the necessary device area as much as possible. Likewise, the bit lines are formed by patterning a conductive layer so as to form the single bit lines which are electrically insulated from one another by a dielectric material.

An example of a non-volatile memory device is based on the NROM (nitride read-only memory) technology. FIG. 1A illustrates a cross-sectional view of an NROM cell between I and I as is illustrated in FIG. 1B. In one embodiment, the NROM cell is an n-channel MOSFET device, wherein the gate dielectric is replaced with a storage layer stack 46. As is illustrated in FIG. 1A, the storage layer stack 46 is disposed above the channel 43 and under the gate electrode 44. The storage layer stack 46 includes a silicon nitride layer 202, which stores the charge, and two insulating silicon dioxide layers 201, 203, which sandwich the silicon nitride layer 202. The silicon dioxide layers 201, 203 have a thickness larger than 5 nm to avoid any direct tunnelling. In the NROM cell illustrated in FIG. 1A two charges are stored at each of the edges adjacent to the n source/drain regions 41, 42.

The NROM cell is programmed by channel hot electron injection (CHE), for example, whereas erasing is accomplished by hot hole enhanced tunnelling (HHET), by applying appropriate voltages to the corresponding bit lines and word lines, respectively.

FIG. 1B illustrates a plan view of an exemplary memory device including an array 100 of a NROM cells. To be more specific, the memory cell array 100 includes word lines 2 extending in a first direction as well as bit lines extending in a second direction. Memory cells 45 are disposed between adjacent bit lines at each point of intersection of a substrate portion with a corresponding word line 2. The first and second source/drain regions 41, 42 form part of corresponding bit lines. The gate electrodes 44 form part of a corresponding word line. At a point of intersection of the word lines and bit lines, the bit lines and the word lines are insulated from each other by a thick silicon dioxide layer (not shown). In order to minimize the area required for the memory cell array 100, it is desirable to reduce the width of the word lines as much as possible. Nevertheless, for contacting the single word lines landing pads 111 having a minimum area are required. Usually, these landing pads 111 are disposed in a fan-out region 110 adjacent to the memory cell array 100. In order to achieve a contact having an appropriate contact resistance, the area of each of the landing pads 111 must have a minimum value. In the peripheral portion 120, the transistors for controlling the action of the memory cell array are disposed. In one embodiment, word line drivers, sense amplifiers and other transistors are disposed in the peripheral portion 120. Usually, the peripheral portion 120 is formed in the CMOS technology. Due to the special programming method for injecting a charge into the memory cells, the transistors disposed in the peripheral portion 120 have to withstand higher voltages than the transistors disposed in the array portion. As a consequence, the channel length of the corresponding transistors in the peripheral portion amount to approximately 0.5 µm and higher. In one embodiment, this channel length cannot be reduced in order to achieve a reduced area of the peripheral portion 120 and, thus, the memory device.

As is illustrated in FIG. 1B, the word lines 2 have a minimum width wmin and a minimum distance dmin from each other. In order to increase the package density of such a memory cell array, the width and the distance of the word lines could be reduced. However, a reduced width of the word lines will result in an increased sheet resistance resulting in an increased access time and, thus, causing an inferior device performance. In addition, when shrinking the width of the word lines 2, a minimum contact area in the fan-out region 110 should be maintained. Alternatively, it is possible to further shrink the distance between adjacent word lines. However, if the word line array is patterned by using a photolithography technique that is usually employed, the lateral dimensions of the word lines as well as the distance between neighbouring word lines is limited by the minimal structural feature size which is obtainable by the technology used. A special problem arises if the landing pads and the array of conductive lines are to be patterned by one single lithographic step. In more detail, the area of the landing pads should be large, whereas the distance of the conductive lines should be small. However, a lithographic step for simultaneously image different ground rules is very difficult to implement. Hence, a patterning method is sought by which it is possible to simultaneously pattern structures having a different ground rule.

SUMMARY

According to one aspect of the present invention, an improved memory device includes a semiconductor substrate having a surface, a plurality of first conductive lines running along a first direction. Each of the first conductive lines have a line width wb and two neighboring ones of the first conductive lines have a distance bs from each other. The line width and the distance is measured perpendicularly with respect to the first direction, respectively, a plurality of second conductive lines running along a second direction, the second direction intersecting the first direction, each of the second conductive lines having a line width wl and two neighboring ones of the second conductive lines having a distance ws from each other, the line width and the distance being measured perpendicularly with respect to the second direction, respectively, a plurality of memory cells, each memory cell being accessible by addressing a corresponding one of said first and second conductive lines, and a plurality of landing pads made of a conductive material, each of the landing pads being connected with a corresponding one of said second conductive lines, wherein each of said landing pads has a width wp and length lp, the width wp being measured perpendicularly with respect to the second direction, the length lp being measured along the second direction, wherein the line width wl of each of the second conductive lines is larger than the distance ws and the width wp of each of the landing pads is larger than the line width wl and the length lp of each of the landing pads is larger than the line width wl.

Accordingly, one embodiment of the present invention provides a memory device including second conductive lines having a width which is larger than the distance between adjacent lines. As a result, the sheet resistance is reduced with respect to conductive lines that are formed with the same ground rule, the conductive lines having a width which is equal to the distance between adjacent conductive lines. Moreover, since the landing pads have a width and a length which both are larger than the width of the conductive lines, contact pads having an increased area can be accomplished. As a consequence, the contact resistance of the contacts is reduced and a proper alignment of the contacts is ensured.

In one case, the lines have a pitch of less than 300 nm, in one embodiment, less than 200 nm.

In the memory device according to one embodiment of the present invention, the first conductive lines can correspond to bit lines and the second conductive lines can correspond to word lines of the memory device, the word lines being disposed above the bit lines, each of the memory cells being able to be accessed by addressing a single bitline or a pair of bitlines and a corresponding word line. Nevertheless, it is also possible that the second conductive lines correspond to the bit lines and the first conductive lines correspond to the word lines.

In one embodiment, the landing pads are arranged in a staggered fashion with respect to the second direction. Thereby, the device area can further be reduced. In one embodiment, the landing pads can be arranged with an increasing distance with respect to a reference position of the memory device, the distance being measured along the second direction.

According to one embodiment of the invention, each of the landing pads has a boundary line which is not parallel to any of the first and second directions, the boundary line intersecting the second direction at an angle α. Thereby, a high packaging density of the landing pads can be obtained, while the overlay requirements of the patterning process are less severe. In addition, landing pads having a large area can be obtained. In one embodiment, the following relation holds: $\tan \alpha = (wl+ws)/(lp+ws)$.

In one embodiment, the plurality of landing pads includes a first and a second subset of landing pads, wherein a point of reference of each of the landing pads of one subset can be connected by a straight line, the straight line intersecting the second direction at an angle β. Thereby, also an increased density of the landing pads can be obtained. In one embodiment, the following relation holds: $\tan \beta = (wl+ws)/(lp+ws)$.

According to one embodiment, the line width wl is larger than the double of the distance ws ($wl > 2 \times ws$). Thereby, the sheet resistance of the conductive lines can further be reduced.

According to one embodiment of the present invention, an improved method of forming a memory device includes providing a semiconductor substrate having a surface, providing a plurality of first conductive lines running along a first direction, each of the first conductive lines having a line width wb and two neighboring ones of the first conductive lines having a distance bs from each other, the line width and the distance being measured perpendicularly with respect to the first direction, respectively, providing a plurality of second conductive lines running along a second direction, the second direction intersecting the first direction, each of the second conductive lines having a line width wl and two neighboring ones of the second conductive lines having a distance ws from each other, the line width and the distance being measured perpendicularly with respect to the second direction, respectively, providing a plurality of memory cells, each memory cell being accessible by addressing corresponding ones of said first and second conductive lines, and providing a plurality of landing pads made of a conductive material, each of the landing pads being connected with a corresponding one of said second conductive lines, wherein each of said landing pads has a width wp and length lp, the width wp being measured perpendicularly with respect to the second direction, the length lp being measured along the second direction, wherein the line width wl of each of the second conductive lines is larger than the distance ws and the width wp of each of the landing pads is larger than the line width wl and the length lp of each of the landing pads is larger than the line width wl.

According to one embodiment, providing the plurality of first or second conductive lines includes the steps of providing a layer stack including at least one conductive layer, providing a hard mask layer and patterning the hard mask layer so as to form hard mask lines, the hard mask lines having a width wl1 and a distance ws1, the hard mask lines having sidewalls, conformally depositing a sacrificial layer, so that the deposited sacrificial layer has horizontal and vertical portions, removing the horizontal portions of the sacrificial layer so as to form spacers on the sidewalls of the hard mask lines, depositing a further layer of the hard mask material, planarizing the surface so that an upper portion of the spacers is uncovered, removing the spacers so as to uncover portions of the layer stack, and etching the uncovered portions of the layer stack thereby forming single conductive lines. Optionally, thereafter, the hard mask material is removed. Nevertheless, the hard mask material can as well be automatically removed by the previous etching steps, or it can be maintained, for example, serving as an insulating layer.

Thereby, it is possible to form the conductive lines having the defined width and distance from each other in a simple manner. In one embodiment, due to the special steps as listed above, it is possible to form the conductive lines having a distance from each other which is beyond the scope of the current lithography tools. To be more specific, the distance between adjacent conductive lines is smaller than the ground rule F of the technology employed.

The materials of the hard mask layer and the sacrificial layer can be arbitrarily selected. Nevertheless, the hard mask layer and the sacrificial must be able to be selectively etched with respect to each other and with respect to the material of the top most layer of the layer stack. Examples for the hard mask material include amorphous silicon and a carbon layer as is commonly used. In one embodiment, such a carbon layer is made of elemental carbon, that is, carbon that is not contained in a chemical compound, optionally including additives such as hydrogen. Examples of the sacrificial layer include silicon oxide and others. The step of patterning the hard mask lines may in one embodiment include an isotropic etching step for reducing the line width of the hard mask lines. In addition, the step of patterning the hard mask layer may incluse a photolithographic step for patterning a photoresist layer. In one case, this lithographic step may include an overexposure step. Thereby, the line width of the hard mask lines is further reduced.

In one embodiment, by the step of patterning the hard mask layer also hard mask pads are formed, the hard mask pads being arranged at an edge region of the array portion defined by the plurality of first and second lines, each of said hard mask pads being connected with a corresponding one of said hard mask lines, by the step of forming spacers also spacers on the sidewalls of the hard mask pads are formed, by the step of depositing a further layer of the hard mask layer, the spaces between adjacent ones of the hard mask pads are filled, by the step of removing the spacers also the spacers on the sidewalls of the hard mask pads are removed, and by the step of etching the uncovered portions of the layer stack also single landing pads are formed, each of the landing pads being connected with a corresponding one of the second conductive lines.

Accordingly, it is possible to form the conductive lines as well as the landing pads during one patterning step. In one embodiment, since according to the invention, the conductive lines and the landing pads have different dimensions, due to the special combination of the steps of patterning the layer stack as defined above and the patterning of the landing pads, it becomes possible to obtain structures having different dimensions by performing one single lithographic step.

In one embodiment, the first conductive lines correspond to bit lines and the second conductive lines correspond to word lines of the memory device, the word lines being disposed above the bit lines, each of the memory cells being able to be accessed by addressing a corresponding word line. Nevertheless, as is clearly to be understood, the first conductive lines can as well correspond to the word lines, whereas the second conductive lines correspond to the bit lines.

According to a further embodiment of the invention, the method further includes depositing a photoresist material covering the hard mask layer, patterning the photoresist material so that finally the portions of the hard mask layer which are located at a position which is not disposed between adjacent hard mask pads are uncovered, etching the hard mask material at those positions which are not covered with the photoresist material so as to uncover portions of the layer stack also at a position which is not disposed between adjacent hard mask pads, so that during the step of etching the uncovered portions of the layer stack also the layer stack is etched at a position which is not disposed between adjacent hard mask pads. Thereby, the additional advantage is achieved that a second set of hard mask pads can be defined in a simple manner. In one embodiment, the second set of hard mask pads will function as a mask for patterning additional landing pads.

According to a further embodiment, during the step of patterning the photoresist material also the hard mask layer is removed from a selected one of said word lines. As a result it is possible to correspondingly pattern the hard mask layer in one single process step, so as to define the portions at which a word line is to be removed and so as to define a second set of landing pads.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1A illustrates a cross-sectional view of a NROM cell.

FIG. 1B illustrates a plan view on a memory device including NROM cells.

FIG. 3A illustrates the substrate after patterning a hard mask layer.

FIG. 3B illustrates a plan view on the resulting memory device.

FIG. 7 illustrates a cross-sectional view after performing a planarizing step.

FIG. 8 illustrates a cross-sectional after removing the sacrificial layer.

FIG. 9A illustrates a cross-sectional view after patterning a photoresist layer.

FIG. 10A illustrates a cross-sectional view after partially removing the hard mask layer.

FIG. 12A illustrates a cross-sectional view of the substrate after patterning the complete word line layer stack.

FIG. 12B illustrates a plan view on the memory device after completely patterning the word line layer stack.

FIG. 13 illustrates a plan view of a memory device according to one embodiment of the present invention.

DETAILED DESCRIPTION

Figure 2:
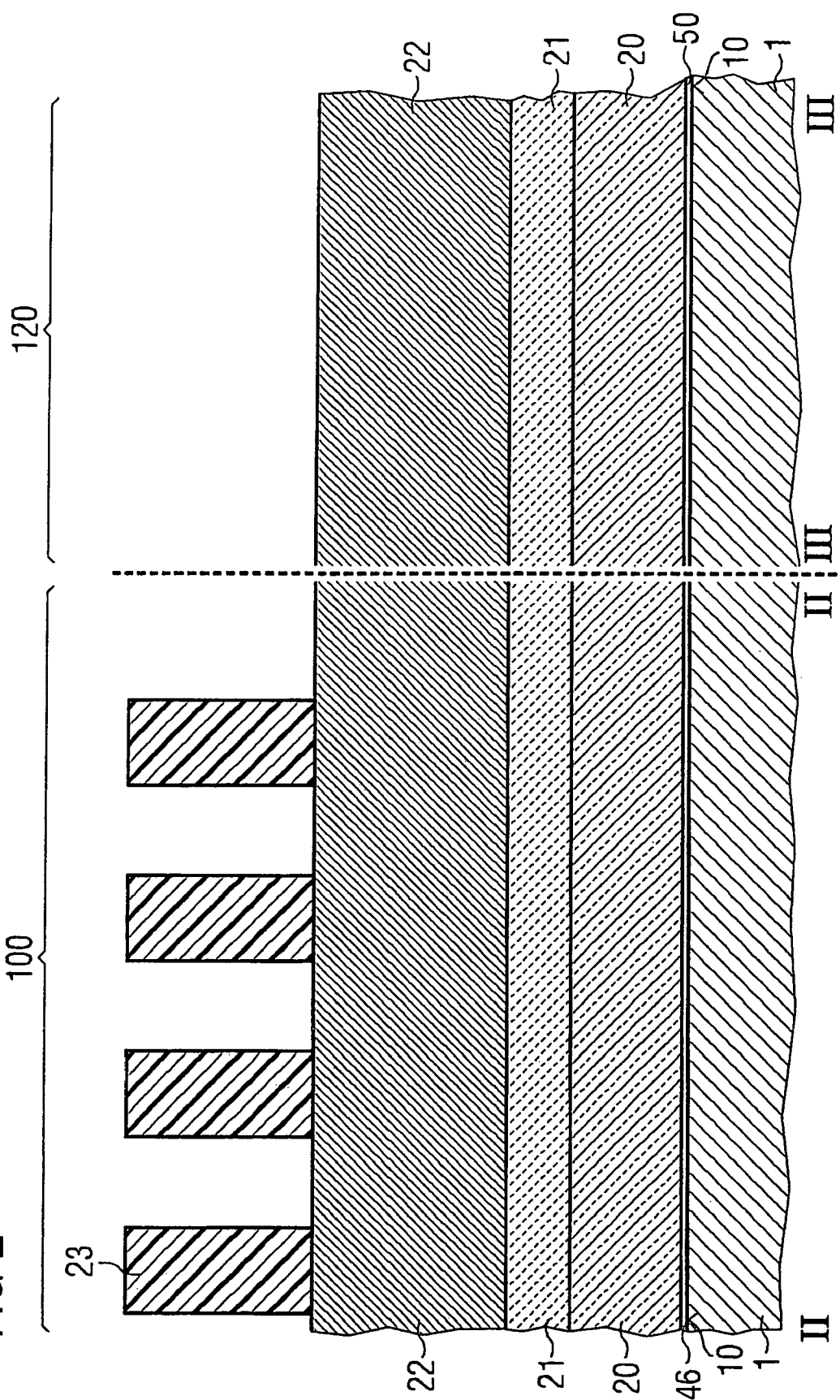
FIG. 2 illustrates a cross-sectional view of a substrate after patterning a photoresist layer.

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated, as they become better understood by reference to the following detailed description. The elements of the drawings are not necessarily to scale relative to each other. Like reference numerals designate corresponding similar parts.

In the following cross-sectional views, the left-hand portion illustrates the cross-sectional view of the array portion 100, whereas the right-hand portion illustrates the cross-sectional view of the peripheral portion 120. In one embodiment, the left-hand portion is taken between II and II, whereas the right-hand portion is taken between III and III as is also illustrated in FIG. 3B.

Starting point for performing the method of one embodiment of the present invention is a semiconductor substrate, in one embodiment, a silicon substrate, which in one case is p-doped. In the substrate portion in which the peripheral portion of the memory device is to be formed, a gate oxide layer 50 is grown by thermal oxidation. In the array portion, after depositing a storage layer stack comprising a first $SiO_2$ layer having a thickness of 1.5 to 10 nm, a $Si_3N_4$ layer having a thickness of 2 to 15 nm followed by a second $SiO_2$ layer having a thickness of 5 to 15 nm, the storage layer stack is patterned so as to form lines. After covering the lines with a protective layer and forming spacers adjacent to the sidewalls of the lines of the layer stack, an implantation step is performed so as to define the source/drain regions in the exposed portions.

A bit line oxide is provided by performing a deposition step, followed by a step of depositing a word line layer stack. These steps are well known to the person skilled in the art of NROM devices, and a detailed description thereof is omitted.

As is illustrated in FIG. 2A, as a result, on the surface 10 of the semiconductor substrate 1 in one embodiment, a p-doped semiconductor substrate, in the array portion 100, the storage layer stack 46, a word line layer stack 20, a silicon nitride cap layer 21 and a first hard mask layer 22 are disposed. The word line layer stack 20 usually includes segments of a first polysilicon layer and a second polysilicon layer having a total thickness of approximately 70 to 110 nm, followed by a titanium layer (not shown), a tungsten nitride layer having a thickness of approximately 5 to 20 nm and a tungsten layer having a thickness of approximately 50 to 70 nm. On top of the tungsten layer, a silicon nitride layer 21 having a thickness of approximately 120 to 180 nm is disposed. In the present embodiment, the hard mask layer 22 is made of amorphous silicon. The hardmask layer 22 can have a thickness of approximately 30 to 50 nm.

In the peripheral portion 120 the same layer stack is disposed on the silicon substrate 1, with the peripheral gate oxide layer 50 being disposed instead of the storage layer stack 46. In one embodiment, the thickness of the peripheral gate oxide layer 50 can be different from the thickness of the storage layer stack 46 in the array portion. A photoresist layer is deposited on the resulting surface and patterned so as to form single lines which are disposed in a periodic manner. The resulting structure is illustrated in FIG. 2, wherein a patterned photoresist layer 23 is illustrated. In one embodiment, the photoresist layer 23 is patterned in a lines/spaces pattern, wherein, in one case, an overexposure is made so as to get the lines smaller than the spaces between adjacent lines. The pitch of the lines/spaces pattern should be at least the twofold of the line width to be achieved.

As is commonly used, an antireflective coating (ARC) layer may be disposed on top of the hard mask layer, for example, a hard mask layer which is made of carbon. In one embodiment, if carbon is taken as the hard mask material, it is necessary to deposit an SiON layer on top of the carbon layer in order to enable the resist strip. In addition, the ARC layer can be disposed beneath the photoresist layer.

In the next step, the photoresist pattern is transferred to the hard mask layer 22. In one embodiment, an etching step is performed, taking the photoresist mask as an etching mask. After removing the photoresist material 23, the structure illustrated in FIG. 3A is obtained, wherein single lines 221 of the hard mask material 22 are formed. In one embodiment, the width wl1 of each of the lines should be smaller than the width, ws1 of the spaces between adjacent lines.

Figure 4:
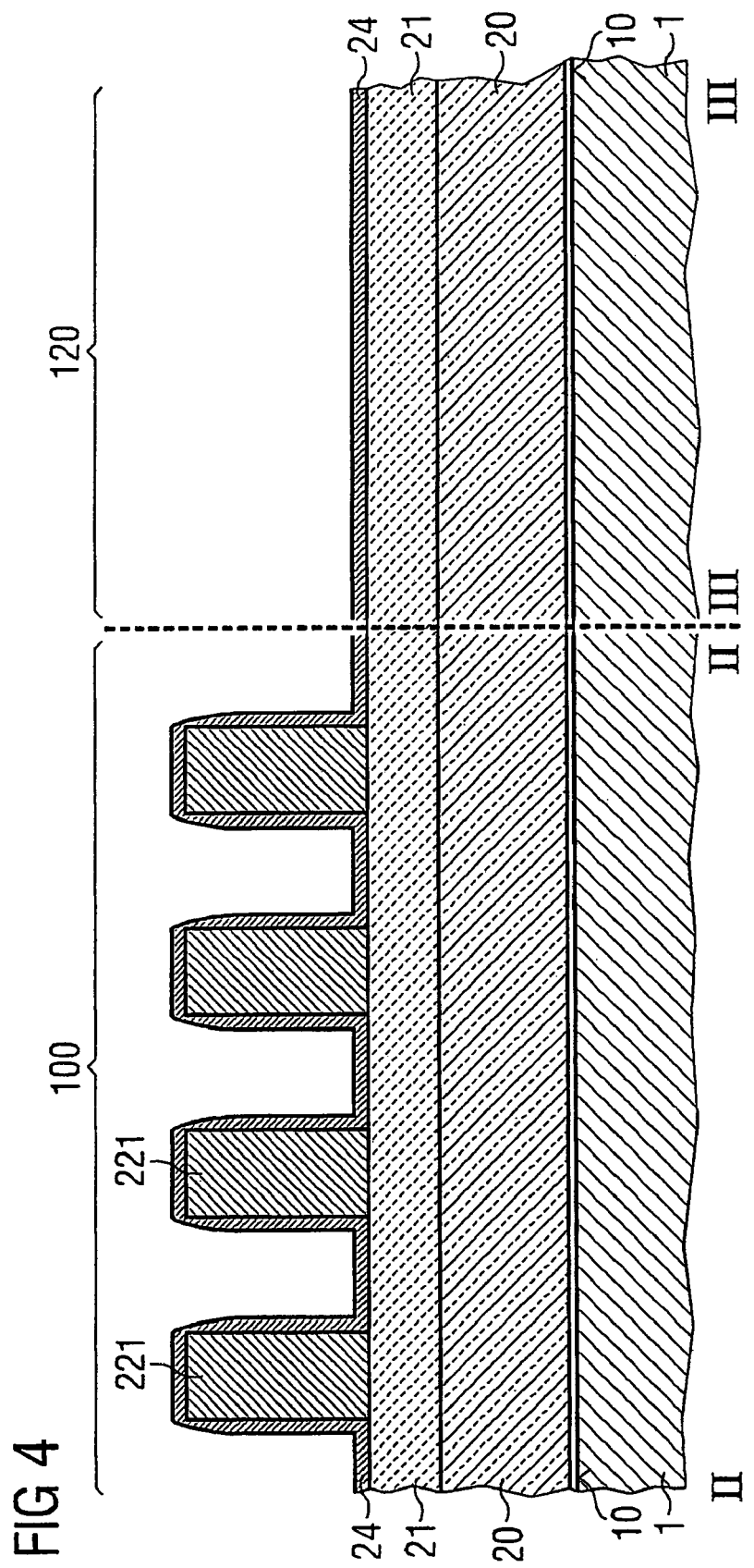
FIG. 4 illustrates a cross-sectional view of the substrate after depositing a sacrificial layer.

FIG. 3B illustrates a plan view of the resulting structure. As can be seen, lines 221 of the hard mask material are formed. The lines 221 are connected with hard mask pads 114 which are disposed in the fan-out portion 110 of the memory device. As can be seen from FIG. 4, lines 221 as well as hard mask pads 114 are formed, whereas the remaining part of the surface is covered with the silicon nitride layer 21.

In the next step, a sacrificial layer 24 is deposited on the resulting surface. In one embodiment, the sacrificial layer can be made of silicon dioxide. The sacrificial layer 24 has a thickness which is determined so as to provide a desired line width of the resulting word lines. In one embodiment, the sacrificial layer can have a thickness of 10 to 40 nm, in one embodiment, 20 to 35 nm, depending on the minimal structural feature size F of the technology employed. As can be seen from FIG. 4, the sacrificial layer 24 is conformally deposited so as to cover the lines 221 in the array portion while forming a planar layer in the peripheral portion 120.

The material of the sacrificial layer as well as of the hard mask layer can be arbitrarily selected. However, it is necessary to select a hard mask material which can be etched selectively with respect to the material of the sacrificial layer and the material of the word line cap layer 21. In addition, it is essential, that the sacrificial layer 24 can be etched selectively with respect to the material of the hard mask layer as well as to the material of the word line cap layer 21.

Figure 5:
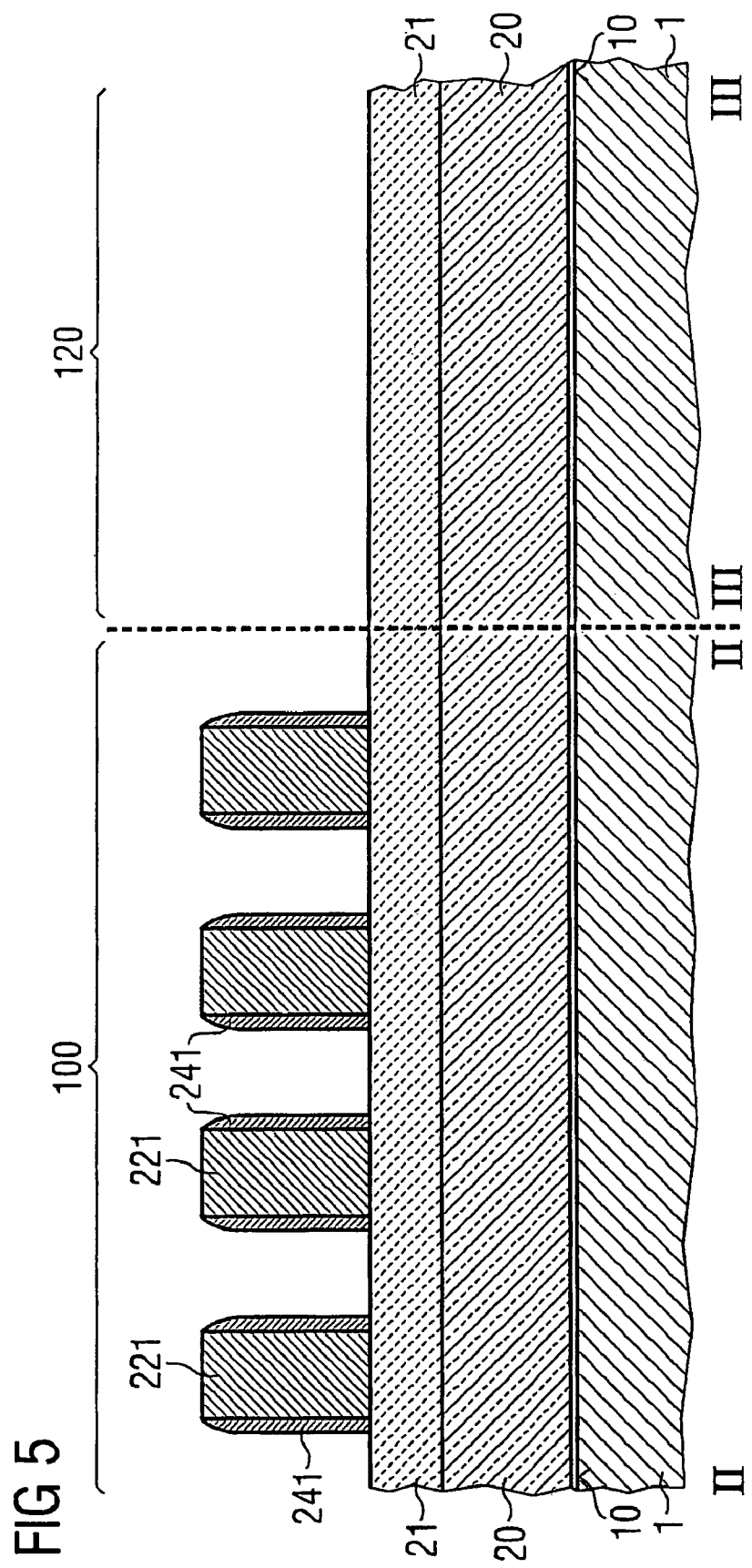
FIG. 5 illustrates a cross-sectional view of the substrate after etching a spacer.

In the next step, a spacer etching step is performed so as to remove the horizontal portions of the sacrificial layer 24, thereby forming sidewall spacers 241 on the sidewalls of each of the lines 221. In addition, the sacrificial layer 24 is completely removed from the peripheral portion. Nevertheless, a spacer is also formed adjacent to the hard mask pads 114 which are illustrated in FIG. 3B. A cross-sectional view of the resulting structure is illustrated in FIG. 5.

In the next step, a further layer of a hard mask material is deposited. In the present embodiment, accordingly, a further layer of amorphous silicon 25 is deposited, so as to fill the spaces between adjacent lines 221. As a result, the spaces between adjacent spacers 241 of the sacrificial layer are filled with the hard mask material 22, 25. By this step, also the spaces between adjacent hard mask pads 114 are filled. Moreover, the fan-out region 110 as well as the peripheral portion 120 of the memory device are covered with the further layer of the hard mask material. According to one embodiment of the present invention, the further layer of the hard mask material is made of the same material as the hard mask material constituting the lines 221 and hard mask pads 114. Nevertheless, also a different material could be chosen for the further layer.

Figure 6:
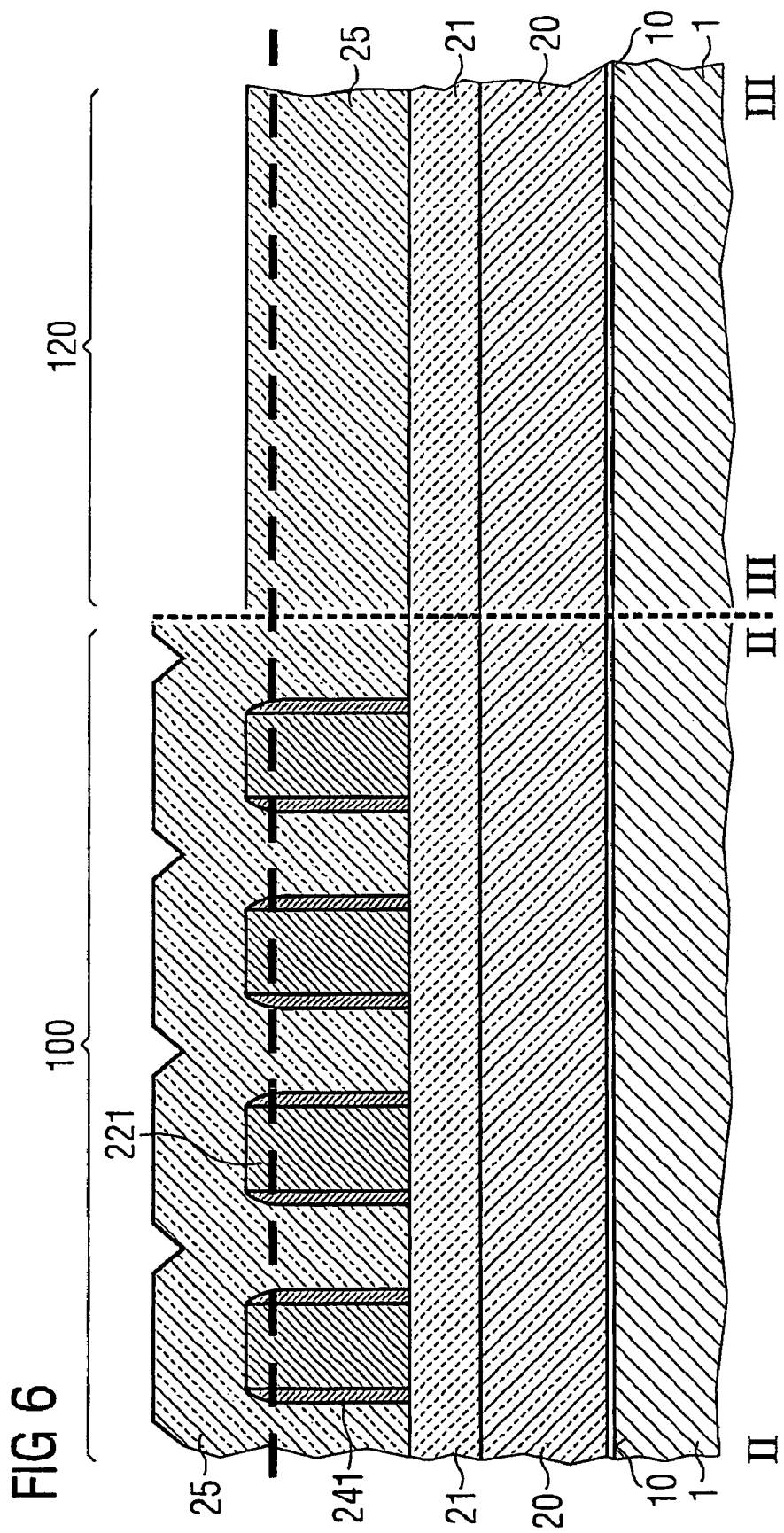
FIG. 6 illustrates a cross-sectional view of the substrate after depositing a hard mask material layer.

Thereafter, a planarizing step, for example a chemical mechanical polishing (CMP) step or a recess etch is performed, so as to remove the upper portion of the deposited layer 25. The position, at which the deposited amorphous silicon layer 25 will be removed from the resulting surface is indicated by broken lines in FIG. 6. As can be seen from FIG. 6, in the array portion, the amorphous silicon layer 25 is laid over the array of lines 221 made of amorphous silicon, whereas in the peripheral portion 120 a layer of amorphous silicon 25 is formed.

As is illustrated in FIG. 7, as a result, lines 221 made of amorphous silicon are formed, which are spaced apart from each other by the silicon dioxide spacer 241 in the array portion 100. As can further be seen from FIG. 7, the distance between adjacent lines 221 is reduced to the width of each of the spacers 241. In the peripheral portion 120, an unpatterned amorphous silicon layer 25 is formed. In the fan-out portion 110, hard mask pads 114 are formed, the spaces between the hard mask pads being filled with the hard mask material, with a silicon dioxide spacer 241 being interposed.

In the next step, an etching step is performed so as to remove the spacer material from adjacent lines 221 of amorphous silicon. The resulting structure is illustrated in FIG. 8. In one embodiment, in the memory cell array portion 100, now, single lines 221 of amorphous silicon are formed, whereas in the peripheral portion 120 the amorphous silicon layer 25 is unpatterned.

In the next step, a further photoresist layer 26 is applied and patterned in accordance with the requirements of the memory device. In one embodiment, in the memory cell array portion 100, an array opening 261 may be formed, in which selected word lines will be removed in a later process step. In one embodiment, in commonly used NROM layouts, word lines are partially removed. In a later process step, at the location of the removed word lines, bit line contacts for contacting the bit lines can be disposed. In addition, the peripheral gate electrodes and peripheral circuitry can be patterned by the present patterning step. Moreover the fan-out region is patterned so as to form landing pads 111 for contacting the word lines. To be more specific, in the array portion, the photoresist layer forms a blocking mask having boundary line which is not parallel to the first nor to the second direction. Accordingly, the fan-out portion is partially covered by the photoresist material, the boundary between the covered and the uncovered portions being defined by an oblique straight line. Nevertheless, as will be discussed later with reference to FIGS. 14A and 14B, the boundary may as well have a shape which is different from a straight line.

In addition, in the peripheral portion, the photoresist layer 26 is patterned so as to form peripheral openings 262 and leaving peripheral photoresist portions 263 in accordance with the circuitry to be formed. The resulting structure after patterning the photoresist layer is illustrated in FIG. 9A.

Figure 9B:
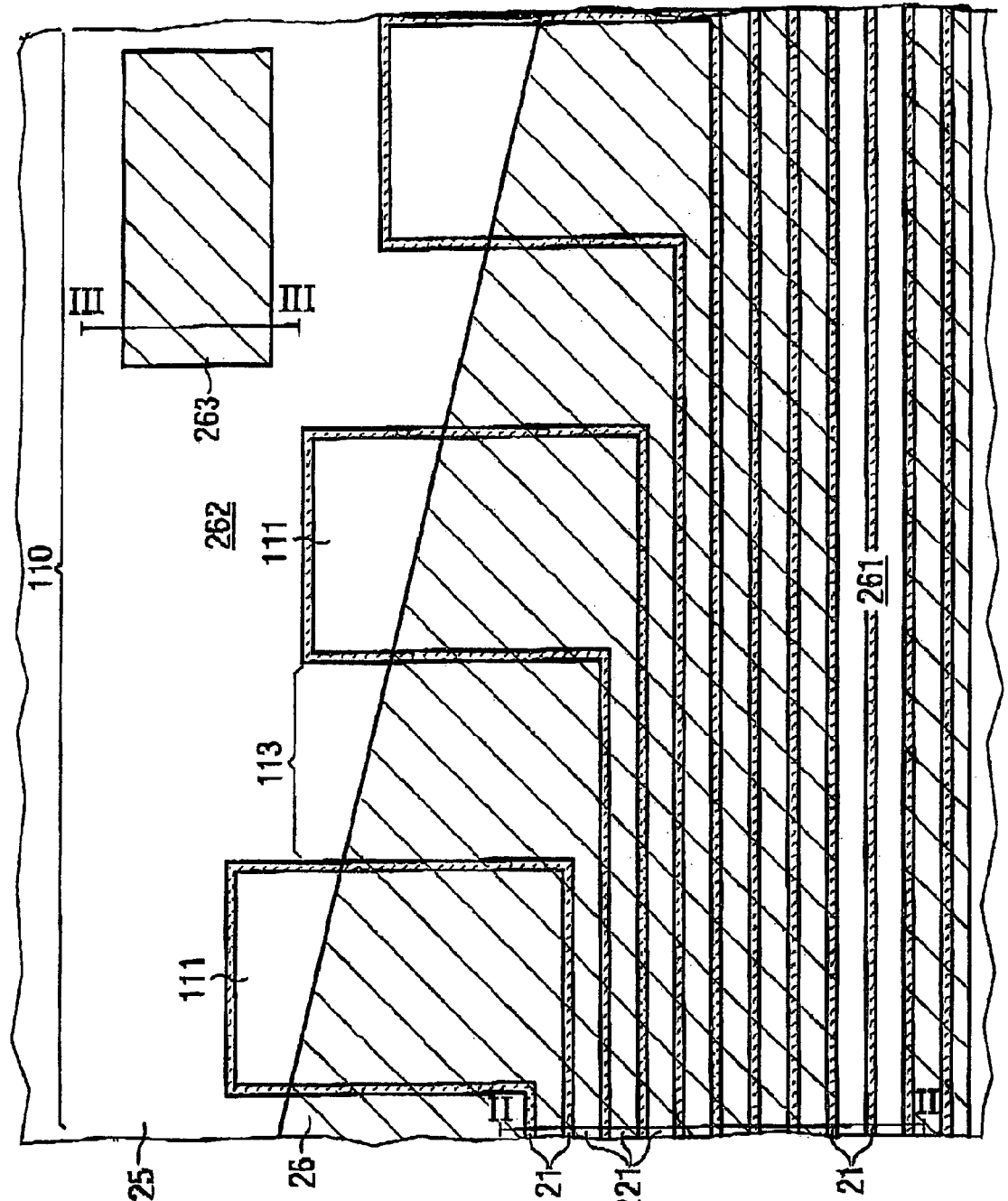
FIG. 9B illustrates a plan view on the memory device after patterning the photoresist layer.

In the cross-sectional view of FIG. 9A, the left-hand portion is taken between II and II, whereas the right-hand portion is taken between III and III as is also illustrated in FIG. 9B.

FIG. 9B illustrates a plan view of the resulting memory device. In one embodiment, as can be seen, in the array portion single lines 221 of amorphous silicon are formed, which are spaced apart by portions of the silicon nitride layer 21. In the fan-out region, the landing pads 111 are partially covered with a photoresist layer 26. In addition, the spaces between adjacent patterned landing pads 111 are as well partially covered with a photoresist layer 26. In the peripheral portion, the surface is covered with the layer of the hard mask material, in one embodiment, with the amorphous silicon layer 25 at those portions, which are not covered by the photoresist material, in one embodiment, the patterned photoresist material 263.

As can further be seen from FIG. 9B, in the array portion 100 part of the word lines are not covered with the photoresist layer 26, at those portions corresponding to the array opening 261. In one embodiment, the exact positioning of the opening 261 is overlay critical whereas the correct position of the peripheral opening 262 at which the surface of the landing pads 111 is covered can be performed less overlay critical. Differently stated, in the array portion the lines 221 of amorphous silicon are protected by the photoresist mask 26, except at those portions corresponding to the array opening 261. In addition, the peripheral photoresist portion 263 is patterned in accordance with the peripheral circuitry to be formed. During the next steps, the peripheral portion as well as the fan-out portion are patterned in accordance with the photoresist mask patterned.

After performing an etching step for removing the amorphous silicon layer, the structure illustrated in FIG. 10A is obtained. As can be seen, in the word line removal portion 3 the lines 221 of amorphous silicon are removed. Moreover, in the peripheral portion 120 the amorphous silicon layer is etched at those portions which have been uncovered due to the patterning of the photoresist layer.

Figure 10B:
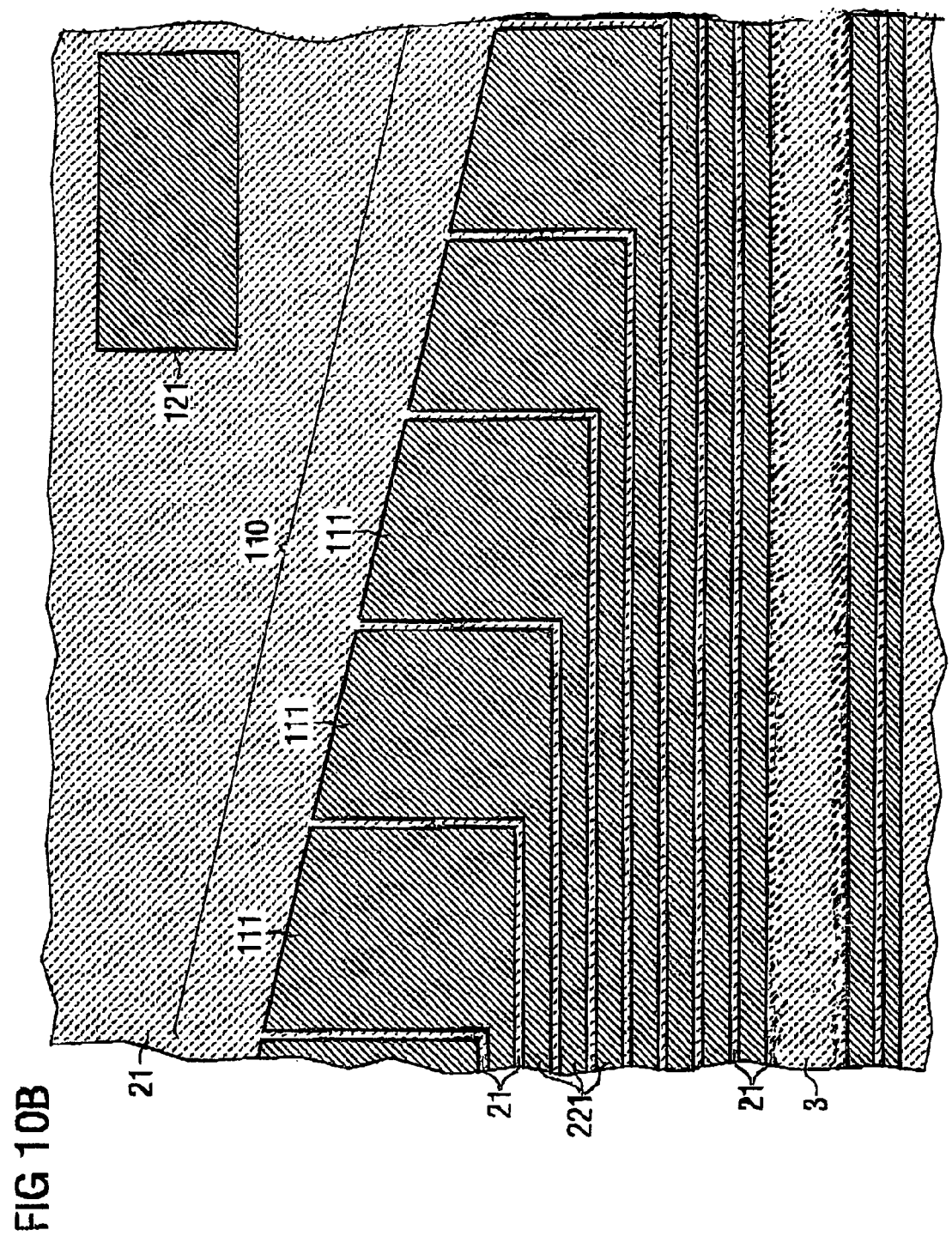
FIG. 10B illustrates a plan view on the memory device after partially removing the hard mask layer.

FIG. 10B illustrates a plan view on the resulting memory device. In one embodiment, after removing the photoresist layer 26, now each of the lines 221 of amorphous silicon is connected with a hard mask pad 114 made of amorphous silicon. The fan-out region 110 is insulated from the patterned peripheral portion 121 by the silicon nitride layer 21. In addition, in the word line removal region, the lines of amorphous silicon are completely removed. Due to the special structure of the photoresist pattern 26 as is illustrated in FIG. 9B, for example, by the step of etching the hard mask layer, a second set 114*b* of hard mask pads is formed, in addition to the first set 114*a* of hard mask pads.

Figure 11:
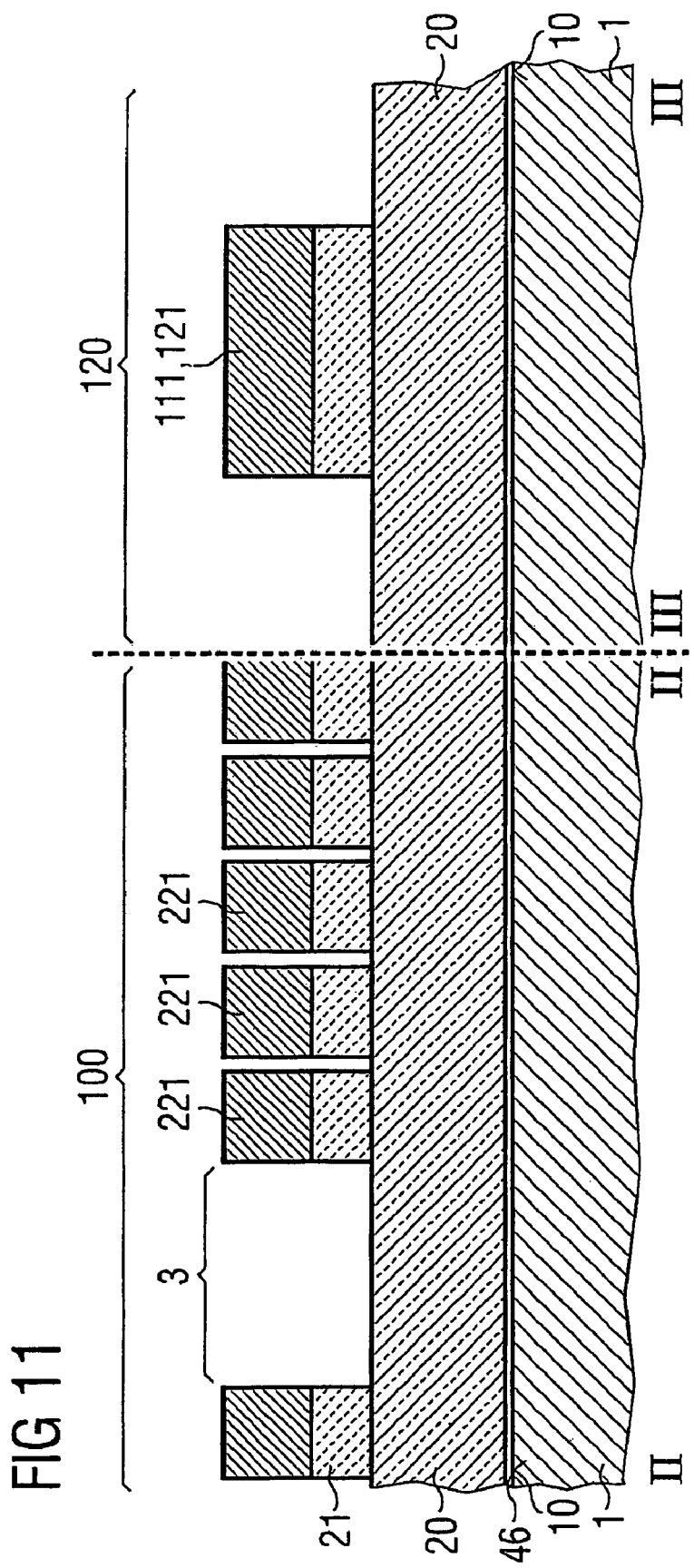
FIG. 11 illustrates a cross-sectional view after patterning the cap nitride layer disposed on of the word line layer stack.

In the next step, the silicon nitride layer is etched in the exposed portions taking the patterned hard mask material as an etching mask. As a consequence, lines made of a layer stack comprising the silicon nitride layer as well as the amorphous silicon layer are formed in the array portion as well as in the peripheral portion 120. The resulting structure is illustrated in FIG. 11.

In the next step, a further etching step for etching the word line layer stack 20 is performed so that, as a consequence, single word lines 2 are formed in the array portion 100, whereas a peripheral gate electrode 51 is formed in the peripheral portion 120. Thereby, in the present example, the hard mask material is removed. As a consequence, as can be seen from FIG. 12A, the word lines 2 now include the word line layer stack as well as the cap nitride layer 21. In addition, in the peripheral portion, the peripheral gate electrode 51 is insulated from the substrate material 1 by the peripheral gate oxide 50.

FIG. 12A illustrates a cross-sectional view of the resulting structure.

In addition, FIG. 12B illustrates a plan view of the resulting structure. As can be seen, now, single word lines 2 are formed which are connected with landing pads 111. On each of the landing pads 111, a contact 112 can be formed. The fan-out region 110 is isolated from the peripheral portion 121 by the silicon dioxide material 51. The contact pads 112 can be connected with a corresponding metal wiring in a following process step.

As can be seen from the structure illustrated in FIG. 12B, word lines 2 having a minimum distance to each other are accomplished, each of the word lines being connected with a landing pad 111 having a larger area. In one embodiment, the landing pads 111 have a larger width than the word lines. Accordingly, contacts 112 can be disposed on each of the landing pads 111, a contact resistance of the contact 112 being reduced due to their increased area.

Starting from the cross-sectional view illustrated in FIG. 12A, the memory device is completed in a manner as is known to the person skilled in the art. In one embodiment, the peripheral portion of the memory device is completed. In addition, in the array portion, insulating layer including BPSG and SiO$_2$ layers are deposited, followed by the definition of bit line contacts at the positions at which the word lines have been removed. In the MO wiring layer conductive lines supporting the bit lines are provided, so that finally a completed memory device is obtained.

FIG. 13 illustrates a plan view of a memory device according to one embodiment of the present invention. As can be seen, the word lines have a width wl which is larger than the distance ws between adjacent word lines. Accordingly, the area of the memory cell array can be effectively utilized for providing word lines having a decreased sheet resistance due to their enlarged width. Moreover, since a distance between adjacent word lines is remarkably reduced in the resulting memory cell array, the stray fields of neighbouring word lines will suppress a parasitic transistor which could be formed between adjacent memory cells.

In more detail, in conventional layouts, such a parasitic transistor has been avoided by performing a so-called anti-punch implant. However, if the distance between neighbouring word lines is reduced, the stray fields will suppress such a parasitic transistor, whereby the process complexity is further reduced while achieving the suppression of the parasitic transistor. In one case, such a stray field has a range of 10 to 20 nm, so that with a reduced distance between the word lines this range is sufficient in order to suppress the parasitic transistor.

For example, the width wl of the word lines can be at least 60 nm, whereas the distance of word lines can be 20 to 40 nm, for example 36 nm or less. In one embodiment, the following relation may hold: wl>1.5×ws.

As can further be seen from FIG. 13, in the fan-out region 110 the landing pads 111 have a width wp and a length lp which both are larger than the width wl of the word lines. As a consequence, the contact resistance of a contact is not increased even though the width of the word lines is decreased.

Each of the landing pads 111 illustrated in FIG. 13 has a boundary line 62 which is not parallel to any of the first and second directions. In one embodiment, each of the boundary lines 62 intersects the second direction at an angle α. As can be gathered from FIG. 13, in one embodiment the following relation holds: $\tan \alpha = (wl+ws)/(lp+ws)$.

As has been described above, by the method of the present invention, it is possible, to pattern the word lines and the landing pads 111 which have completely different dimensions in one lithographic step which has been difficult to implement by conventional methods.

Figure 14A:
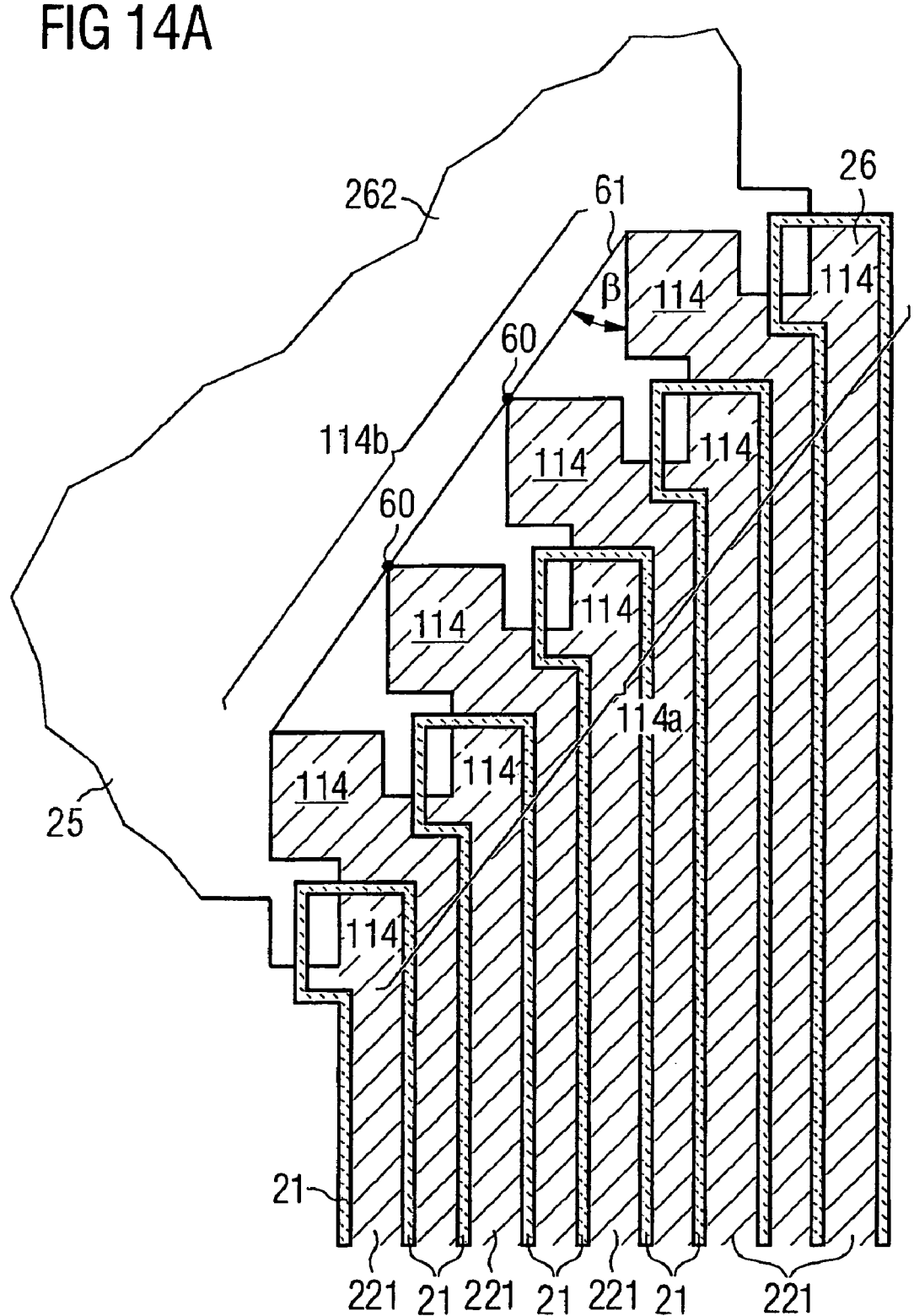
FIG. 14A illustrates a layout of the fan-out according to a further embodiment of the present invention.
Figure 14B:
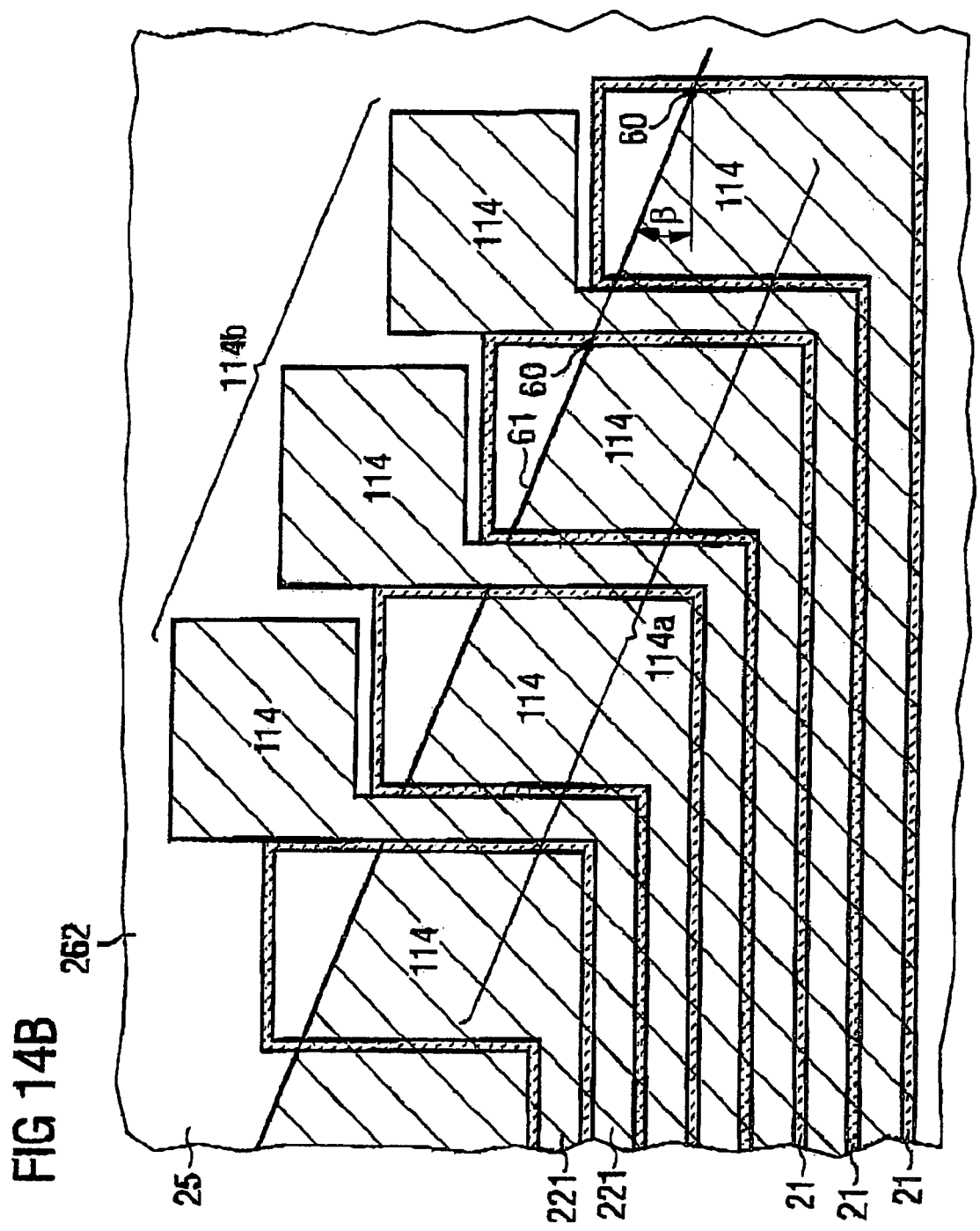
FIG. 14B illustrates a further possible layout of the fan-out according to one embodiment of the present invention.

By using a different photolithographic mask for patterning the photoresist layer covering the array portion during the step of defining the landing pads 111, arbitrary arrangements of landing pads 111 can be implemented. For example, FIGS. 14A and 14B illustrate exemplary patterns of the photoresist material in the step which has been described with reference to FIG. 9B, respectively. As is illustrated, the edge of the photolithographic mask can be different from a straight line so that—as a result—a higher packaging density of the landing pads can be achieved. In one embodiment, in FIGS. 14A and 14B the second set 114b of hard mask pads 114 are not disposed between the first set 114a of hard mask pads 114 but they are located outside a region defined by the first set 114a of hard mask pads 114.

As a result, after etching the hard mask material so as to define the landing pads, a first and a second subset of landing pads will be formed. In addition, a point of reference 60 of each of the landing pads of one subset can be connected by a straight line 61 wherein the straight line 61 intersects the second direction at an angle β. In one embodiment, the following relation holds: $\tan \beta = (wl+ws)/(lp+ws)$.

Accordingly, the packaging density of the landing pads can be further increased.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit including a memory device comprising:
   first conductive lines running along a first direction;
   second conductive lines running along a second direction, the second direction intersecting the first direction, each of the second conductive lines having a line width wl;
   memory cells being at least partially formed in a semiconductor substrate, each memory cell being accessible by addressing corresponding ones of said first and second conductive lines; and
   landing pads made of a conductive material, each of the landing pads being configured to be connected with a corresponding one of said second conductive lines, wherein each of said landing pads has a width wp and length lp, the width wp being measured perpendicularly with respect to the second direction, the length lp being measured along the second direction;
   wherein the width wp of each of the landing pads is larger than the line width wl and a length lp of each of the landing pads is larger than the line width wl; and
   wherein the landing pads are arrange in a staggered fashion with respect to the second direction and with an increasing distance with respect to a reference position of the memory device, the distance being measured along the second direction.

2. The integrated circuit of claim 1, wherein the first conductive lines correspond to bit lines and the second conductive lines correspond to word lines of the memory device, the word lines being disposed above the bit lines.

3. The integrated circuit of claim 2, wherein the following relation holds: wl>1.5 ×ws, wherein ws corresponds to a distance between two neighboring ones of the second conductive lines.

4. The integrated circuit of claim 1, wherein each of the landing pads has a boundary line that is not parallel to any of the first and second directions, the boundary line intersecting the second direction at an angle α.

5. The integrated circuit of claim 4, wherein the following relation holds: $\tan \alpha = (wl+ws)/(lp+ws)$, wherein ws corresponds to a distance between the two neighboring ones of the second conductive lines.

6. The integrated circuit of claim 1, wherein the plurality of landing pads comprises a first and a second subset of landing pads, wherein a point of reference of each of the landing pads of one subset can be connected by a straight line, the straight line intersecting the second direction at an angle β.

7. The integrated circuit of claim 6, wherein the following relation holds: $\tan \beta = (wl+ws)/(lp+ws)$, wherein ws corresponds to a distance between two neighboring ones of the second conductive lines.

8. The integrated circuit of claim 1, wherein the line width of each of the second conductive lines is larger than a distance between neighboring ones of the second conductive lines.

9. An integrated circuit including a memory devices, comprising:
- first conductive lines adjacent each other running in a first direction;
- second conductive lines adjacent each other running in a second direction, the second direction intersecting the first direction;
- memory cells being at least partially formed in a semiconductor substrate, each memory cell being accessible by addressing corresponding ones of said first and second conductive lines; and
- landing pads made of a conductive material, each of the landing pads being configured to be connected with a corresponding one of said second conductive lines;
- means for reducing sheet resistance with respect to the plurality of second conductive lines, for increasing contact pad area, and for reducing contact resistance of the contacts, wherein the first and second directions are perpendicular to each other, wherein a width of each of the second conductive lines is larger than the second distance between the second conductive lines, wherein a width of each of the landing pads is larger than the width of each of the second conductive lines, and wherein a length of each of the landing pads is larger than the width of each of the second conductive lines.

10. The integrated circuit of claim 9, wherein the first conductive lines correspond to bit lines and the second conductive lines correspond to word lines of the memory device, the word lines being disposed above the bit lines.

11. The integrated circuit of claim 9, wherein the landing pads are arranged in a staggered fashion with respect to the second direction.

12. An integrated circuit comprising:
- first conductive lines running along a first direction;
- second conductive lines running along a second direction, the second direction intersecting the first direction, each of the second conductive lines having a line width;
- memory cells formed in a semiconductor substrate, each memory cell being accessible by addressing the first and second conductive lines; and
- landing pads made of a conductive material, each of the landing pads being configured to be connected with one of the second conductive lines, wherein each of the landing pads has a width and length, the width being measured perpendicularly with respect to the second direction, the length being measured along the second direction;
- wherein the width of each of the landing pads is larger than the line width and the length of each of the landing pads is larger than the line width.

* * * * *

UNITED STATES PATENT AND TRADEMARK OFFICE
CERTIFICATE OF CORRECTION

| | | |
|---|---|---|
| PATENT NO. | : 7,378,727 B2 | Page 1 of 1 |
| APPLICATION NO. | : 11/327054 | |
| DATED | : May 27, 2008 | |
| INVENTOR(S) | : Dirk Caspary et al. | |

It is certified that error appears in the above-identified patent and that said Letters Patent is hereby corrected as shown below:

Title page, item 63 insert --The Domestic Priority Data As Claimed by Applicant Serial No. 11/241,820 filed September 30, 2005--.

Column 12, line 36, delete "arrange" and insert in place thereof --arranged--.

Column 12, line 46, delete "xws" and insert in place thereof --x ws--.

Column 13, line 5, delete "devices" and insert in place thereof --device--.

Signed and Sealed this

Sixth Day of January, 2009

JON W. DUDAS
*Director of the United States Patent and Trademark Office*